(12) United States Patent
Sakai et al.

(10) Patent No.: US 7,855,509 B2
(45) Date of Patent: Dec. 21, 2010

(54) TRANSPARENT DRYING AGENT AND ORGANIC ELECTROLUMINESCENT DEVICE

(75) Inventors: Keiko Sakai, Yamato (JP); Masakuni Ikagawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 12/236,896

(22) Filed: Sep. 24, 2008

(65) Prior Publication Data

US 2009/0085480 A1    Apr. 2, 2009

(30) Foreign Application Priority Data

Sep. 27, 2007 (JP) .............................. 2007-251550
Sep. 12, 2008 (JP) .............................. 2008-235148

(51) Int. Cl.
*H01L 51/54* (2006.01)

(52) U.S. Cl. ...................................... 313/512; 524/381

(58) Field of Classification Search .................. 313/512, 313/481, 545–549, 550–562; 524/381, 382
See application file for complete search history.

(56) References Cited

U.S. PATENT DOCUMENTS

2005/0116638 A1* 6/2005 Chung et al. ................. 313/512
2006/0097633 A1* 5/2006 Cho et al. ..................... 313/512

FOREIGN PATENT DOCUMENTS

JP        2003-144830        5/2003
JP        2006-59571         3/2006

* cited by examiner

*Primary Examiner*—Joseph L Williams
*Assistant Examiner*—Andrew J Coughlin
(74) *Attorney, Agent, or Firm*—Oblon, Spivak, McClelland, Maier & Neustadt, L.L.P.

(57) ABSTRACT

A transparent drying agent includes a mixture of an alkoxide of the Group II, Group III or Group IV metal and a transparent organic polymer which is inert to and soluble with this metal alkoxide.

6 Claims, 2 Drawing Sheets

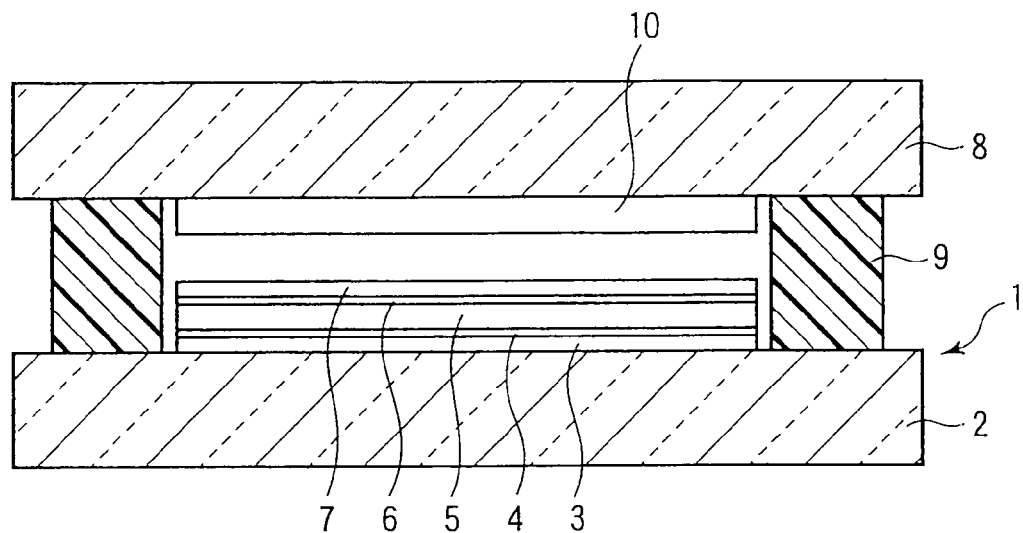
F I G. 1
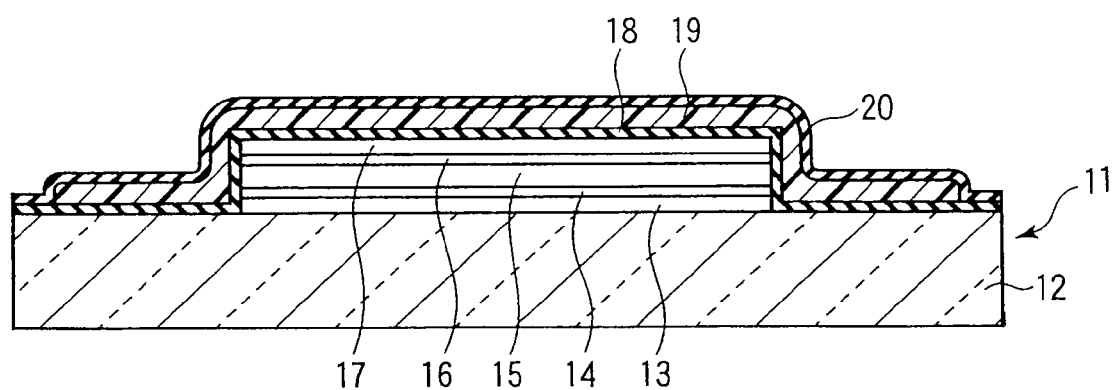
F I G. 2

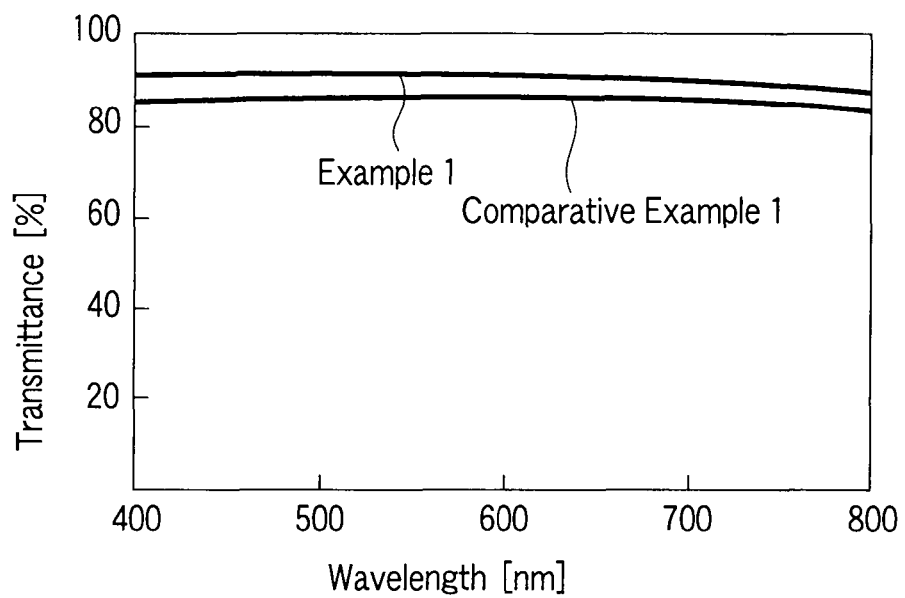
F I G. 3
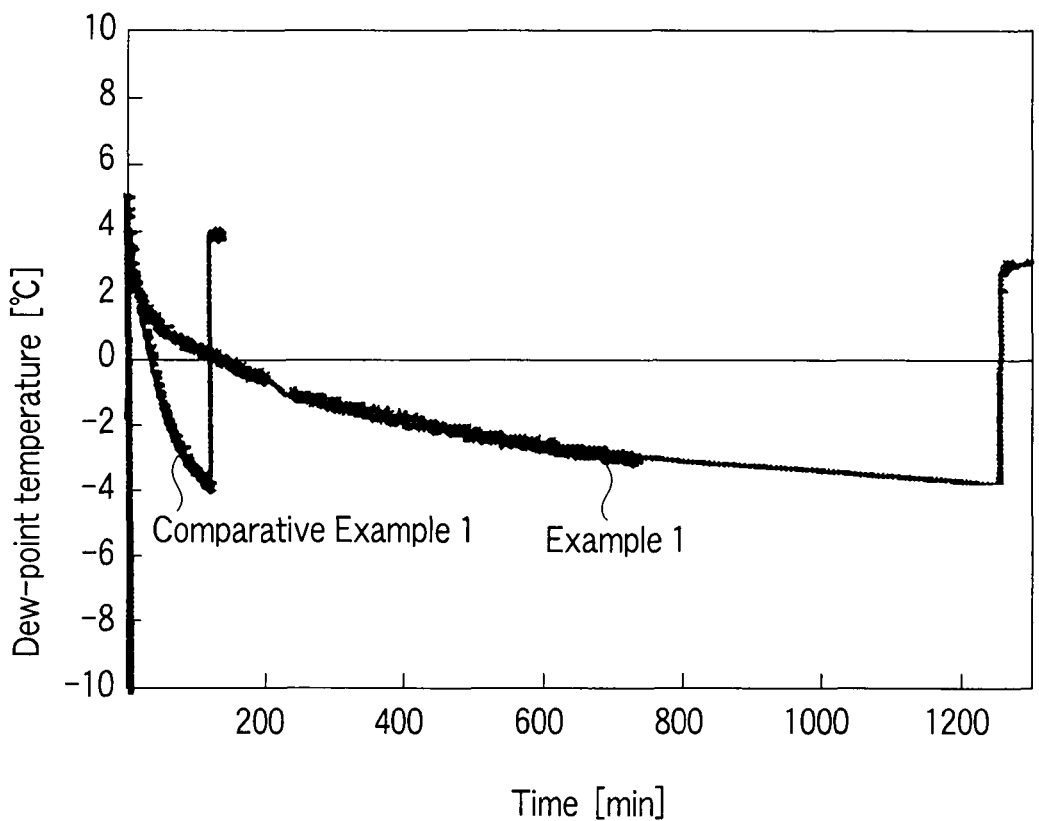
F I G. 4

US 7,855,509 B2

TRANSPARENT DRYING AGENT AND ORGANIC ELECTROLUMINESCENT DEVICE

CROSS-REFERENCE TO RELATED APPLICATIONS

This application is based upon and claims the benefit of priority from prior Japanese Patent Applications No. 2007-251550, filed Sep. 27, 2007; and No. 2008-235148, filed Sep. 12, 2008, the entire contents of both of which are incorporated herein by reference.

BACKGROUND OF THE INVENTION

1. Field of the Invention

The present invention relates to a transparent drying agent and to an organic electroluminescent device provided with this transparent drying agent.

2. Description of the Related Art

The organic electroluminescent device is a self-emission device provided with a luminous layer. This electroluminescent diode is degraded by moisture and oxygen to produce a non-emitting region called a dark spot.

In conventional organic electroluminescent devices, a transparent counter-substrate (glass cover) is applied to an organic electroluminescent substrate provided with a luminous layer by using an adhesive layer in a nitrogen atmosphere, that is, in an atmosphere free from the open air, to protect the diode from moisture and oxygen. However, it is difficult for such an organic electroluminescent device to shut out the intrusion of moisture in the open air completely to protect the diode.

From this fact, in the bottom-emission organic electroluminescent device in which light is extracted from the organic electroluminescent substrate side provided with a luminous layer, a recess portion is formed on the glass cover stuck to this organic electroluminescent substrate with the adhesive layer being interposed therebetween and a colored drying agent is arranged in this recess portion to trap the intruded moisture.

In the top-emission organic electroluminescent device in which light is extracted from the glass cover, on the other hand, the colored drying agent cannot be disposed on the glass cover unlike the bottom-emission type. Therefore, in Jpn. Pat. Appln. KOKAI Publication No. 2003-144830, there is disclosed a top-emission organic electroluminescent device in which a transparent drying agent constituted of, for example, aluminum alkoxide is disposed on the glass cover. However, when the above organic metal complex absorbs moisture, it produces cracks and is made opaque. Thus, the extraction of light from the glass cover is made difficult in a short time after the start of use.

Also, in Jpn. Pat. Appln. KOKAI Publication No. 2006-59571, there is disclosed an organic electroluminescent panel in which a trapping agent such as trioctyl aluminum is formed on the counter-substrate.

BRIEF SUMMARY OF THE INVENTION

According to a first aspect of the present invention, there is provided a transparent drying agent comprising a mixture of an alkoxide of the Group II, Group III or Group IV metal and a transparent organic polymer which is inert to and soluble with this metal alkoxide.

According to a second aspect of the present invention, there is provided an organic electroluminescent device comprising:

an organic electroluminescent substrate having a luminous layer;

a transparent counter-substrate disposed opposite to and secured to the electroluminescent substrate with a frame sealing member interposed therebetween; and a transparent drying agent film formed on the inside surface of the transparent counter-substrate enclosed by the frame sealing member and including a mixture of an alkoxide of the Group II, Group III or Group IV metal and a transparent organic polymer which is inert to and soluble with this metal alkoxide.

According to a third aspect of the present invention, there is provided an organic electroluminescent device comprising:

an organic electroluminescent substrate having a luminous layer; and a protective film formed on the organic electroluminescent substrate, the protective film comprising a transparent drying agent film formed on the surface of the organic electroluminescent substrate having the luminous layer and a transparent moisture-proof film formed on the surface of the transparent drying agent film, and the transparent drying agent film including a mixture of an alkoxide of the Group II, Group III or Group IV metal and a transparent organic polymer which is inert to and soluble with this metal alkoxide.

BRIEF DESCRIPTION OF THE SEVERAL VIEWS OF THE DRAWING

FIG. 1 is a sectional view showing a top-emission organic electroluminescent diode according to a second embodiment;

FIG. 2 is a sectional view showing a top-emission organic electroluminescent diode according to a third embodiment;

FIG. 3 is a view showing a relationship between the wavelength of the transmission light and the transmittance in each transparent drying agent film after absorbing moisture, obtained by Comparative Example 1 and Example 1; and FIG. 4 is a view showing a relationship between the time and the temperature of dew-point in each transparent drying agent film obtained by Comparative Example 1 and Example 1.

DETAILED DESCRIPTION OF THE INVENTION

A transparent drying agent and a top-emission organic electroluminescent device according to an embodiment of the present invention will be explained in detail.

First Embodiment

A transparent drying agent according to a first embodiment is constituted of a mixture of an alkoxide of the Group II, Group III or Group IV metal and a transparent organic polymer which does not react with but is soluble with this metal alkoxide.

As the metal alkoxide, for example, aluminum alkoxide may be used. Examples of the aluminum alkoxide may include OleDry-L3 (trade name, manufactured by Futaba Corporation, including 25 wt % decane solvent).

The organic polymer is preferably a silicon-containing polymer and, particularly, a silicon-containing polymer having a silyl group. Examples of the silicon-containing polymer may include copolymers of 30 to 35 mol % of methylhydrosiloxane and 65 to 70 mol % of dimethylsiloxane. The organic polymer is preferably contained in an amount of 25 to 70° by volume in the above mixture.

The transparent drying agent according to the first embodiment which is explained above is constituted of a mixture of an alkoxide of the Group II, Group III or Group IV metal and a transparent organic polymer which does not react with but is soluble with this metal alkoxide, and therefore, it has high moisture-absorbing ability due to the metal alkoxide and the metal alkoxide is supported by the organic polymer which acts as a matrix, so that the transparent drying agent can maintain transparency without occurrence of cracks of the metal alkoxide after it absorbs moisture.

The use of a silicon-containing polymer and, particularly, a silicon-containing polymer having a silyl group as the above organic polymer makes it possible to reliably prevent the occurrence of cracks of the metal alkoxide after it absorbs moisture and to maintain high transparency.

Second Embodiment

The top-emission organic electroluminescent device according to a second embodiment comprises a transparent counter-substrate (for example, a glass cover) disposed opposite to and secured to an organic electroluminescent substrate having a luminous layer with a frame sealing member interposed therebetween. The frame sealing member made of, for example, a UV-curable resin. A transparent drying agent film is formed on the inside surface of the transparent counter-substrate enclosed by the above frame sealing member. The transparent drying agent film is made of a mixture of an alkoxide of the Group II, Group III or Group IV metal and a transparent organic polymer which does not react with but is soluble with this metal alkoxide.

As the metal alkoxide and organic polymer constituting the above transparent drying agent film, the same materials as those described above may be used. This transparent drying agent film may be formed on the above organic electroluminescent substrate by the coating method.

Inert gas such as nitrogen is allowed to be sealed in the space enclosed by the above organic electroluminescent substrate, transparent counter-substrate and the frame sealing member.

Such a top-emission organic electroluminescent device (for example, an organic electroluminescent diode) has a structure as shown in FIG. 1.

An organic electroluminescent substrate 1 is provided with a glass plate 2. An anode 3 is formed on the surface of the above glass plate 2 excluding its peripheral edge. A hole transfer layer 4, an organic luminous layer 5, a cathode buffer layer 6 and a cathode 7 are formed in this order on the anode 3.

A transparent counter-substrate (for example, glass cover) 8 is disposed opposite to and secured to the glass plate 2 of the above organic electroluminescent substrate with a frame sealing member 9 interposed therebetween. The frame sealing member 9 is made of, for example, a UV-curable resin and encloses the above layers including the anode 3 and the cathode 7. A transparent drying agent film 10 having the above composition is formed on the inside surface of the transparent counter-substrate 8 enclosed by the frame sealing member 9.

The top-emission organic electroluminescent device according to the second embodiment as explained above has the structure in which the transparent counter-substrate (for example, a glass cover) is disposed opposite to and secured to the organic electroluminescent substrate provided with a luminous layer via the frame sealing member and the transparent drying agent film having the above composition is formed on the inside surface of the transparent cover enclosed by the frame sealing member. Therefore, moisture intruded into the space between the organic electroluminescent substrate and transparent cover enclosed by the frame sealing member can be absorbed by the transparent drying agent film and removed. As a result, the above luminous layer can be prevented from being degraded by moisture. Also, the cathode positioned on the outermost layer of the organic electroluminescent substrate can be prevented from being oxidized and corroded by moisture. Also, the transparent drying agent film positioned in the path through which light is extracted from the luminous layer can keep its transparency even after it absorbs moisture as mentioned above.

Therefore, a top-emission organic electroluminescent device can be provided which can prevent the luminous layer from being degraded by moisture and can therefore maintain its initial wide emission region for a long period of time.

Third Embodiment

A top-emission organic electroluminescent device according to a third embodiment is provided with an organic electroluminescent substrate having a luminous layer. A transparent protective film is provided with a two-layer structure in which a transparent drying agent film and a transparent moisture-proof film are formed in this order on the organic electroluminescent substrate including the luminous layer. A transparent drying agent film is made of a mixture of an alkoxide of the Group II, Group III or Group IV metal and a transparent organic polymer which does not react with but is soluble with this metal alkoxide. The transparent protective film is preferably a three-layer laminate structure in which a first moisture-proof film, drying agent film and a second moisture-proof film are formed in this order on the surface of the organic electroluminescent substrate.

The transparent drying agent film having the above composition may be formed on an organic electroluminescent substrate by the coating method and can be therefore formed in a desired thickness, for example a thickness of 1 to 100 µm. As the metal alkoxide and the organic polymer, the same materials as those explained in the first embodiment may be used. The organic polymer is preferably a silicon-containing polymer and particularly a silicone-containing polymer having a silyl group. The organic polymer is preferably contained in an amount of 25 to 70% by volume in the above mixture.

The transparent moisture-proof film is preferably made of, for example, a polyparaxylene, silicon oxide, aluminum oxide or silicon oxynitride. Such a moisture-proof film may be formed by the vapor deposition method. The thickness of the moisture-proof film is preferably 5 µm or less and more preferably 50 nm to 5 µm in consideration of the throughput in the production of an organic electroluminescent device.

Such a top-emission organic electroluminescent device (for example, an organic electroluminescent diode) has, for example, a structure as shown in FIG. 2.

An organic electroluminescent substrate 11 is provided with a glass plate 12. An anode 13 is formed on the surface of the glass plate 12 excluding its peripheral edge. A hole transfer layer 14, an organic luminous layer 15, a cathode buffer layer 16 and a cathode 17 are formed in this order on the anode 13. A transparent first moisture-proof film 18 is formed on the glass plate 12 including the cathode 17 by, for example, the vapor deposition method. A transparent drying agent film 19 having the above composition is formed on the first moisture-proof film 18 by, for example, the coating method. This drying agent film 19 is disposed such that its periphery is disposed on the inside of the periphery of the glass plate 12. Specifically, the first moisture-proof film 18 is exposed from the periphery of the drying agent film 19. A transparent second moisture-proof film 20 is formed on the first moisture-proof film 18 including the drying agent film 19. With this structure, the whole laminate constituted of the anode 13, hole transfer layer 14, organic luminous layer 15, cathode buffer layer 16 and cathode 17 is covered with a transparent protective film having a three-layer structure consisting of the first moisture-proof film 18, drying agent film 19 and second moisture-proof film 20. Also, the transparent drying agent film 19 is covered with the upper and lower surfaces including the side surfaces, that is, the whole body thereof is covered with the transparent first and second moisture-proof films 18 and 20 in such a manner that it is sandwiched between the both moisture-proof films 18 and 20.

The top-emission organic electroluminescent device according to the third embodiment as mentioned above is provided with a transparent protective film in which a transparent drying agent film (constituted of a mixture of an alkoxide of the Group II, Group III or Group IV metal and a transparent organic polymer which does not react with but is soluble with this metal alkoxide) and a transparent moisture-proof film are formed in this order on an organic electroluminescent substrate having a luminous layer. For this reason, the moisture-proof film can protect the drying agent film from moisture in the air. Even if moisture in the air penetrates through the moisture-proof film, it can be absorbed by the drying agent film and removed. As a result, the luminous layer can be prevented from being degraded by moisture. In addition, the cathode positioned on the outermost layer of the organic electroluminescent substrate can be prevented from being oxidized and corroded by moisture.

Also, the transparent drying agent film positioned in the path through which light is extracted from the luminous layer to the protective film side can keep its transparency even after it absorbs moisture as mentioned above.

Moreover, this organic electroluminescent device, like the second embodiment, needs no transparent counter-substrate and is also provided with the protective film prepared by forming the transparent drying agent film and transparent moisture-proof film in this order directly on the organic electroluminescent substrate including the luminous layer. Therefore, the thickness of the organic electroluminescent device can be reduced. Particularly, the drying agent film having the above composition may be formed on the above substrate by the coating method. This coating method enables the formation of a relatively thick drying agent film (for example, 1 to 100 μm) with a higher throughput than the vapor deposition method. Fine irregularities on the surface of the luminous layer and the like are absorbed, to make it possible to flatten the surface.

This prevents the luminous layer from being degraded by moisture to make it possible to maintain the initial wide emission region for a long period of time. Also, a top-emission organic electroluminescent device which can be thin-layered can be provided.

In the third embodiment, the transparent protective film may be formed by dispersing a transparent agent in a transparent moisture-proof film.

The present invention will be explained below in more detail by way of examples.

Comparative Example 1

Coating-type alkoxyaluminum (trade name: OleDry-L3, manufactured by Futaba Corporation, including 25 wt % decane solvent) was applied to a glass plate in an amount of 7.6 μL/cm². Then, the substrate was heat-treated at 150° C. for 10 minutes to vaporize the decane solvent, thereby forming a transparent drying agent film.

Example 1

Alkoxyaluminum (trade name: OleDry-L3, manufactured by Futaba Corporation, including 25 wt % decane solvent) and a thermal dehydration product of a silicon-containing polymer (trade name: HMS-301, manufactured by Gelest, Inc., a copolymer of 25 to 30 mol % of methylhydrosiloxane and 65 to 70 mol % of dimethylsiloxane) were mixed in a volume ratio of 70:30 to prepare a coating drying agent. Then, the coating drying agent was applied to a glass plate in an amount of 7.6 μL/cm². Then, the substrate was heat-treated at 150° C. for 10 minutes to vaporize the decane solvent, thereby forming a transparent drying agent film.

The transparent drying agent film formed on the glass plate obtained in each of Comparative Example 1 and Example 1 was exposed to the air for 24 hours to allow it to adsorb moisture and then, the appearance of the film was observed and the transmittance of the film was measured. A relationship between the wavelength of the transmission light and the measured transmittance is shown in FIG. 3.

From these results, the occurrence of cracks was observed in the transparent drying agent film of Comparative Example 1 after moisture was absorbed and a reduction in transmittance was observed along with the occurrence of cracks.

On the contrary, the occurrence of cracks was not observed in the transparent drying agent film of Example 1 after moisture was absorbed and therefore it was found that this film had high transmittance.

Also, each transparent drying agent film prepared in Comparative Example 1 and Example 1 was disposed together with a glass plate in a closed container equipped with a dew-point instrument to measure the temperature of dew-point, i.e. volume of the moisture absorbed by each transparent drying agent film based on a reduction in dew-point caused by the absorption of moisture. A relationship between time and the measured temperature of dew-point is shown in FIG. 4.

As is clear from FIG. 4, although the transparent drying agent film of Example 1 has a lower dropping rate of dew point than the transparent drying agent film of Comparative Example 1, it has the same ultimate dew point as the transparent drying agent film of Comparative Example 1. It is therefore found that the transparent drying agent film of Example 1 is scarcely degraded in moisture-absorbing capacity.

As mentioned above, it is clarified that the drying agent film constituted of a mixture of alkoxyaluminum and a silicon-containing polymer is not degraded in the ability required for a drying agent, is free from the physical and geometrical change such as cracks caused by absorption of moisture and can maintain excellent moisture-absorbing ability for a long period of time.

Example 2

A top-emission organic electroluminescent diode was produced as a self-emission device on the surface of a 24 mm-wide and 0.7 mm-thick glass substrate. Then, a 1.6 mm-thick cover glass, on one surface of which a transparent drying agent film having the same composition as that of Example 1 was formed, was disposed opposite to the above glass substrate such that the transparent drying film was positioned on the cathode side, which was then sealed using a UV-curable resin to produce a top-emission organic electroluminescent diode in which nitrogen gas was filled as shown in the aforementioned FIG. 1.

Comparative Example 2

A top-emission organic electroluminescent diode was produced in the same manner as in Example 2 except that a cover glass with no transparent drying agent film formed on one surface thereof was used.

Each organic electroluminescent diode obtained in Example 2 and Comparative Example 2 was subjected to an accelerated moisture-proof test in which the diode was exposed to an atmosphere of 85° C. and 85% RH. Specifically, after the diode was exposed to the atmosphere, it was taken out. Then, the emitting region (area) was measured when the diode was allowed to emit light to extract the light from the cover glass side. This measurement was repeated over 350 hours.

As a result, the organic electroluminescent diode of Comparative Example 2 was decreased in the emitting region to 20% of the initial region in the first test.

On the other hand, it was confirmed that the organic electroluminescent diode of Example 2 kept 99.8% of the emitting region when light was extracted from the cover glass side even after the accelerated moisture-proof test was conducted for 360 hours.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transparent drying agent comprising a mixture of an alkoxide of the Group II, Group III or Group IV metal and a silicon-containing polymer, wherein the silicon-containing polymer is a copolymer of 30 to 35 mol % of methylhydrosiloxane and 65 to 70 mol % of dimethylsiloxane.

2. The transparent drying agent according to claim 1, wherein the silicon-containing polymer is contained in an amount of 25 to 70% by volume in the mixture.

3. An organic electroluminescent device comprising:
    an organic electroluminescent substrate having a luminous layer; and
    a protective film formed on the organic electroluminescent substrate, the protective film comprising a transparent drying agent film formed on the surface of the organic electroluminescent substrate having the luminous layer and a transparent moisture-proof film formed on the surface of the transparent drying agent film, and the transparent drying agent film including a mixture of an alkoxide of the Group II, Group III or Group IV metal and a silicon-containing polymer, wherein the silicon-containing polymer is a copolymer of 30 to 35 mol % of methylhydrosiloxane and 65 to 70 mol % of dimethylsiloxane.

4. The device according to claim 3, wherein the silicon-containing polymer is contained in an amount of 25 to 70% by volume in the mixture.

5. The device according to claim 3, wherein the transparent moisture-proof film is made of polyparaxylene, silicon oxide, aluminum oxide or silicon oxynitride.

6. The device according to claim 3, wherein the protective film is a three-layer laminate film in which a transparent moisture-proof film is further interposed between the organic electroluminescent substrate and the drying agent film.

* * * * *